United States Patent
Chen et al.

(10) Patent No.: US 9,344,306 B2
(45) Date of Patent: May 17, 2016

(54) METHOD FOR DYNAMICALLY ADJUSTING SIGNAL PROCESSING PARAMETERS FOR PROCESSING WANTED SIGNAL AND COMMUNICATIONS APPARATUS UTILIZING THE SAME

(75) Inventors: Yuan Chen, Hsinchu (TW); Ting-Che Tseng, Hsinchu (TW); Zih-Yin Ding, New Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 878 days.

(21) Appl. No.: 13/197,984

(22) Filed: Aug. 4, 2011

(65) Prior Publication Data

US 2012/0034891 A1 Feb. 9, 2012

Related U.S. Application Data

(60) Provisional application No. 61/371,847, filed on Aug. 9, 2010.

(51) Int. Cl.
*H04L 27/00* (2006.01)
*H04L 27/22* (2006.01)
*H03G 3/30* (2006.01)

(52) U.S. Cl.
CPC .......... *H04L 27/0008* (2013.01); *H03G 3/3078* (2013.01); *H04L 27/22* (2013.01)

(58) Field of Classification Search
CPC ..... H04W 72/02; H04W 16/14; H04W 88/06; H04L 27/0008; H04L 27/22; H03G 3/3078

USPC .............................................. 455/63.1, 67.11
See application file for complete search history.

(56) References Cited

U.S. PATENT DOCUMENTS

| | | | |
|---|---|---|---|
| 7,725,118 B2 * | 5/2010 | Yang et al. | 455/502 |
| 8,095,176 B2 * | 1/2012 | Sudak | 455/552.1 |
| 8,185,058 B2 * | 5/2012 | Capretta et al. | 455/67.13 |
| 8,412,263 B2 * | 4/2013 | Sudak | 455/552.1 |
| 8,693,950 B2 * | 4/2014 | Desai | 455/41.2 |
| 2008/0003969 A1 * | 1/2008 | Segev et al. | 455/277.1 |
| 2008/0051085 A1 * | 2/2008 | Ganton | 455/435.2 |
| 2010/0197235 A1 * | 8/2010 | Wilhelmsson | 455/63.3 |
| 2012/0033762 A1 * | 2/2012 | Tseng et al. | 375/316 |

* cited by examiner

*Primary Examiner* — Lewis West
(74) *Attorney, Agent, or Firm* — McClure, Qualey & Rodack, LLP

(57) ABSTRACT

A communications apparatus is provided. A signal processing device receives an RF signal comprising a wanted signal complying with a first wireless communications protocol from an air interface and processes the RF signal according to one or more signal processing parameter(s) to obtain the wanted signal. An interference detector analyzes one or more characteristic(s) of an interference signal of the wanted signal. The interference signal complies with a second wireless communications protocol different from the first wireless communication protocol. A coexistence optimization controller is coupled to the signal processing device and the interference detector, obtains information regarding the characteristic(s) of the interference signal from the interference detector and dynamically adjusts the signal processing parameter(s) according to the characteristic(s) of the interference signal.

34 Claims, 12 Drawing Sheets

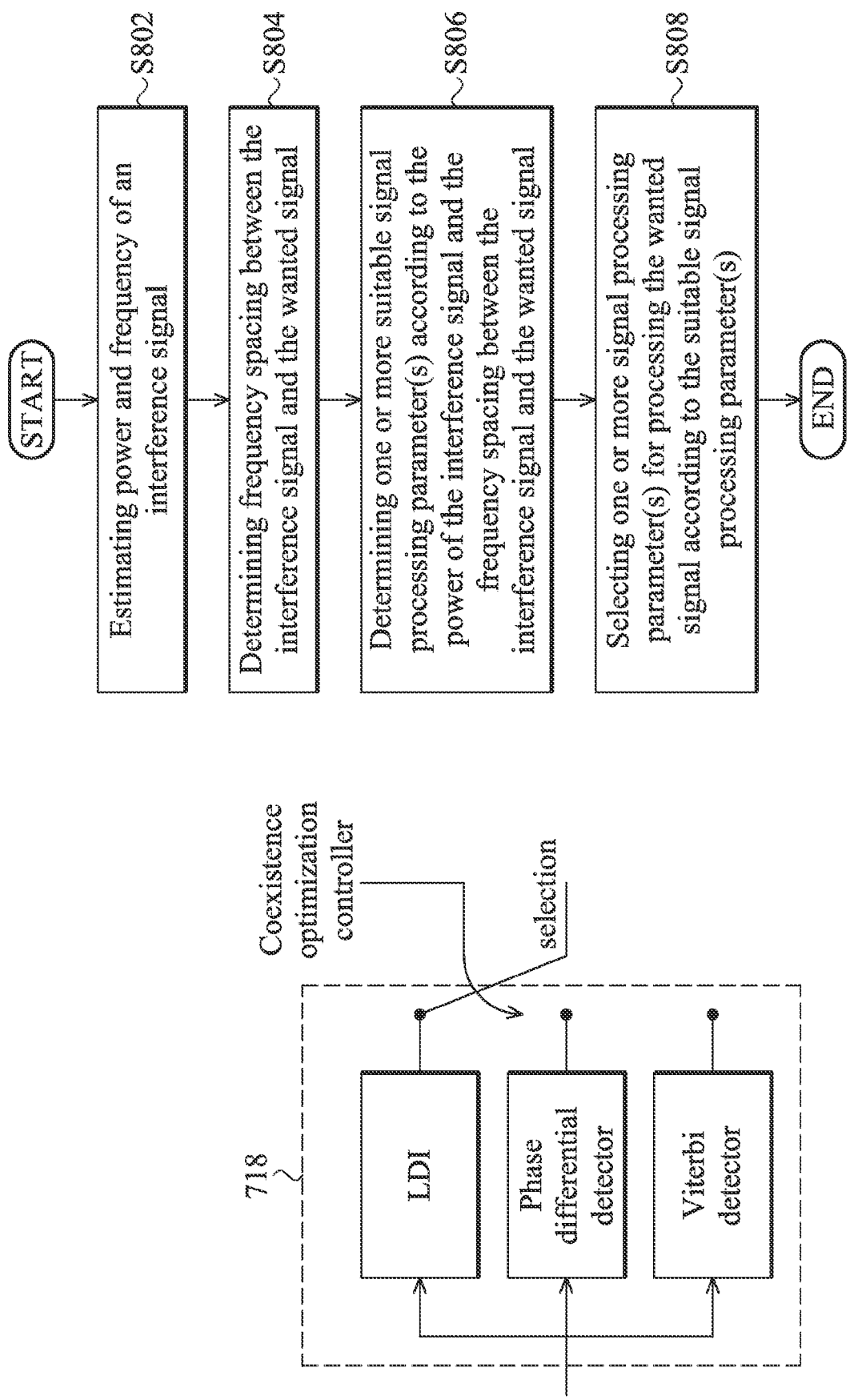

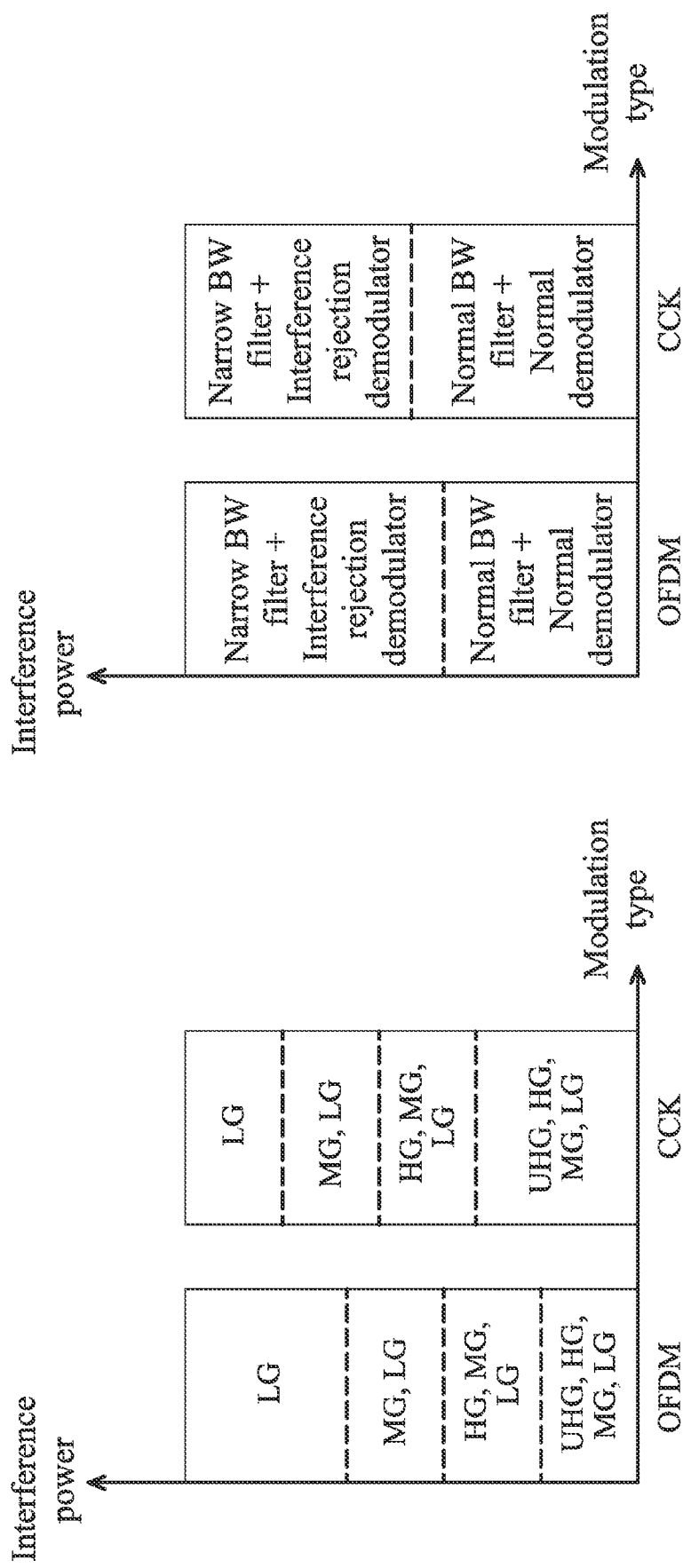

METHOD FOR DYNAMICALLY ADJUSTING SIGNAL PROCESSING PARAMETERS FOR PROCESSING WANTED SIGNAL AND COMMUNICATIONS APPARATUS UTILIZING THE SAME

CROSS REFERENCE TO RELATED APPLICATIONS

This application claims the benefit of U.S. Provisional Application No. 61/371,847 filed 2010 Aug. 9 and entitled "MULTI-RADIO COEXISTENCE OPTIMIZATION". The entire contents of which are hereby incorporated by reference.

BACKGROUND OF THE INVENTION

1. Field of the Invention

The invention relates to a communications apparatus and methods for dynamically adjusting one or more signal processing parameter(s) utilized for processing a wanted signal.

2. Description of the Related Art

With the development of wireless communications technology, mobile electronic devices may be provided with more than one wireless communications service, such as a Bluetooth, Wireless Fidelity (WiFi), Worldwide Interoperability for Microwave Access (WiMAX) wireless communications service, and so on. In this regard, the overlapping or adjacent operating frequency bands among the different wireless communications services causes transmission performances thereof to degrade. Table 1 below shows the operating frequency bands for a WiMAX, WiFi and Bluetooth wireless communications service.

TABLE 1

| Category of Wireless Communications Services | | |
|---|---|---|
| Usage | Wireless Communications service | Frequency band |
| Wide Area Network (WAN) | WiMAX | 2.300-2.400 GHz |
| | | 2.496-2.690 GHz |
| | | 3.300-3.800 GHz |
| Local Area Network (LAN) | WiFi | 2.412-2.4835 GHz |
| | | 4.9-5.9 GHz |
| Personal Area Network (PAN) | Bluetooth | 2.402-2.480 GHz |

As shown in Table 1, the frequency bands of WiFi and Bluetooth overlap with each other. In addition, the frequency bands of WiFi and Bluetooth are adjacent to the frequency bands of the WiMAX. When these wireless communications modules are integrated in a mobile electronic devices, simultaneous transmissions and receptions by different wireless communications modules cause transmission interference. FIG. 1 shows an exemplary received signal power at around the 2.4 GHz band. The strong interference signal adjacent to a wanted signal may cause the RF front end circuit to operate nonlinearly, and the large leakage of the interference signal may further reduce the signal to noise ratio (SNR) of the wanted signal.

Therefore, a novel receiver circuit and method for dynamically adjusting the signal processing parameters adopted in the receiver circuit for processing the received signals are highly required.

BRIEF SUMMARY OF THE INVENTION

Communications apparatuses and methods for dynamically adjusting one or more signal processing parameter(s) utilized by a signal processing device for processing a wanted signal are provided. An embodiment of a communications apparatus comprises a signal processing device, an interference detector and a coexistence optimization controller. The signal processing device receives a radio frequency (RF) signal comprising a wanted signal from an air interface and processes the RF signal according to one or more signal processing parameter(s) to obtain the wanted signal. The interference detector analyzes one or more characteristic(s) of an interference signal of the wanted signal. The coexistence optimization controller is coupled to the signal processing device and the interference detector, obtains information regarding the characteristic(s) of the interference signal from the interference detector and dynamically adjusts the signal processing parameter(s) according to the characteristic(s) of the interference signal. The wanted signal complies with a first wireless communications protocol, and the interference signal complies with a second wireless communication protocol different from the first wireless communications protocol.

An embodiment of a method for dynamically adjusting one or more signal processing parameter(s) utilized by a signal processing device for processing a wanted signal comprises: obtaining information regarding power and frequency of an interference signal being an interference of the wanted signal; determining a frequency spacing between the interference signal and the wanted signal; determining one or more suitable signal processing parameter(s) according to the power of the interference signal and the frequency spacing between the interference signal and the wanted signal; and selecting one or more signal processing parameter(s) for processing the wanted signal according to the suitable signal processing parameter(s).

Another embodiment of a method for dynamically adjusting one or more signal processing parameter(s) utilized by a signal processing device for processing a wanted signal comprises: obtaining information regarding power of an interference signal being an interference of the wanted signal; obtaining information regarding a modulation type of the interference signal; determining one or more suitable signal processing parameter(s) according to the power and the modulation type of the interference signal; and selecting one or more signal processing parameter(s) for processing the wanted signal according to the suitable signal processing parameter(s).

Another embodiment of a method for dynamically adjusting one or more signal processing parameter(s) utilized by a signal processing device for processing a wanted signal comprises: obtaining information regarding power of an interference signal being an interference of the wanted signal; determining a modulation type of the wanted signal; determining one or more suitable signal processing parameter(s) according to the power of the interference signal and the modulation type of the wanted signal; and selecting one or more signal processing parameter(s) for processing the wanted signal according to the suitable signal processing parameter(s).

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 7 shows an exemplary block diagram of the demodulation module according to an embodiment of the invention;

FIG. 8 shows a flow chart of a method for dynamically adjusting one or more signal processing parameter(s) utilized by a signal processing device for processing a wanted signal according to an embodiment of the invention;

FIG. 13 shows the suitable signal processing parameters determined according to the power and modulation type of the interference signal according an embodiment of the invention;

FIG. 14 shows the suitable signal processing parameters determined according to the power and modulation type of the interference signal according to another embodiment of the invention;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
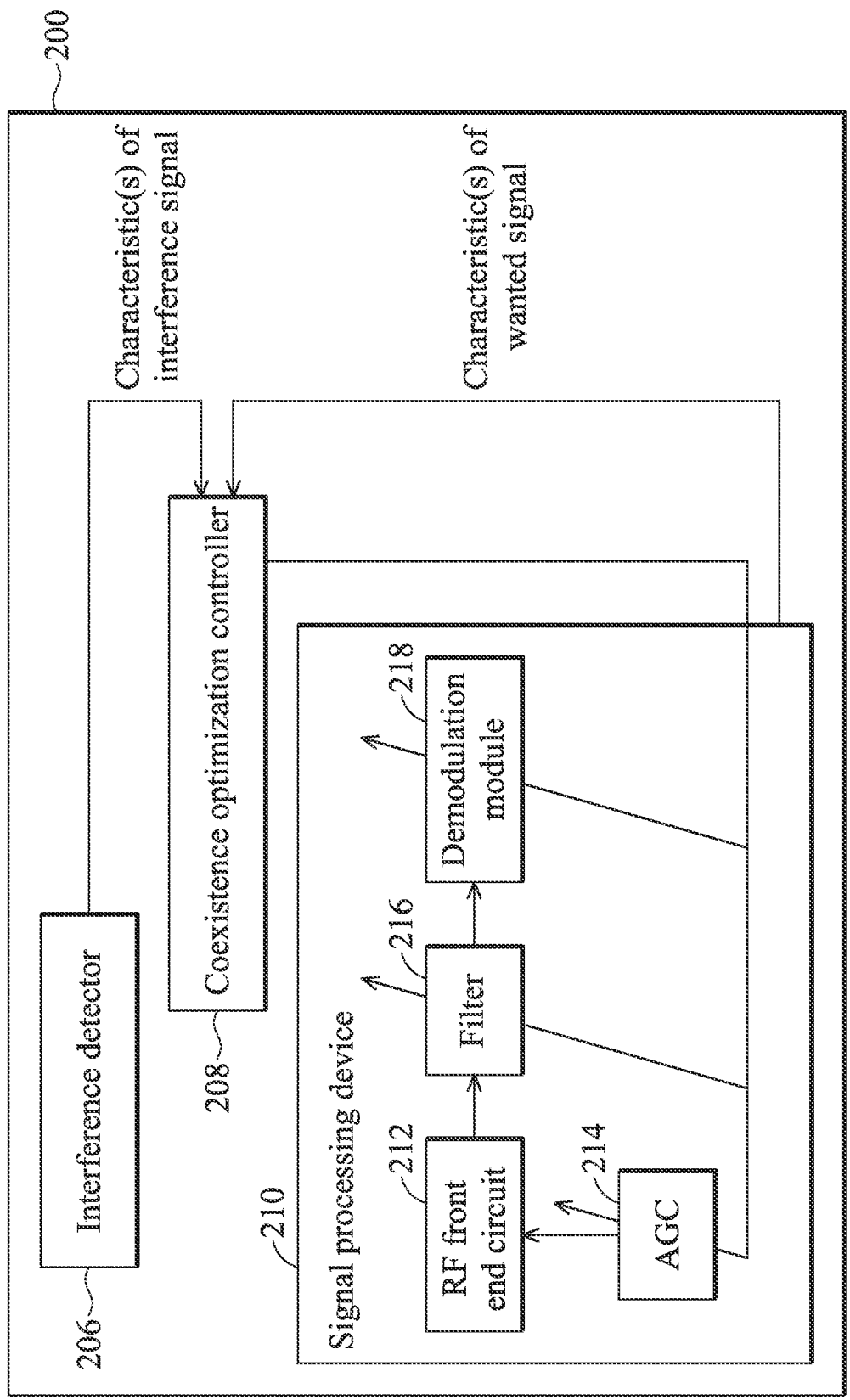
FIG. 2 shows a schematic block diagram of a communications apparatus according to an embodiment of the invention.

FIG. 2 shows a schematic block diagram of a communications apparatus according to an embodiment of the invention. Please be noted that FIG. 2 presents a simplified block diagram, in which some elements required by a conventional receiver are omitted here for brevity. However, note that the invention should not be limited to what is shown in the FIG. 2. The communications apparatus 200 may comprise at least a signal processing device 210, an interference detector 206 and a coexistence optimization controller 208. The signal processing device 210 may comprise a plurality of hardware devices (such as the RF front end circuit 212, the filter 216 and the demodulation module 218 as shown) for receiving an RF signal comprising a wanted signal from an air interface, analyzing one or more characteristic(s) of the wanted signal and processing the RF signal according to one or more signal processing parameter(s) to obtain the wanted signal. The interference detector 206 is adjacent to the signal processing device 210 and is utilized for analyzing one or more characteristic(s) of an interference signal, which is an interference of the wanted signal. Note that the wanted signal usually complies with a first wireless communications protocol, and the interference signal usually complies with a second wireless communication protocol different from the first wireless communications protocol. The interference detector 206 may comprise a plurality of hardware devices for receiving an RF signal comprising the interference signal, and detecting the characteristic(s) of the interference in the process. Or the interference detector 206 may obtain/analyze the characteristic(s) of the interference from messages received from another wireless transceiving module co-located with the signal processing device 210. The coexistence optimization controller 208 is coupled to the signal processing device 210 and the interference detector 206 for obtaining information regarding the characteristic(s) of the interference signal from the interference detector 206 and information regarding the characteristic(s) of the wanted signal from the signal processing device 210, and dynamically adjusting the signal processing parameter(s) according to the characteristic(s) of the interference signal and/or the characteristic(s) of the wanted signal.

According to an embodiment of the invention, the communications apparatus 200 may be a notebook, a cellular phone, a portable gaming device, a portable multimedia player, a Global Navigation Satellite System (GNSS) receiver, a receiver, or others, and may provide multiple types of different communications services. To be more specific, the communications apparatus 200 may comprise a plurality of wireless communications modules (as shown in FIG. 3 and FIG. 4) for providing different wireless communications services.

Note that in the embodiments of the invention, the signal processing device 210 may be implemented as a portion of a signal processing module in a the wireless communications module utilized for processing the received RF signal, and the interference detector 206 and the coexistence optimization controller 208 may be either integrated in or configured outside of the wireless communications module. For example, according to a first embodiment of the invention, the interference detector 206 and the coexistence optimization controller 208 may be implemented as dedicated devices independent of the wireless communications modules. For another example, according to a second embodiment of the invention, the signal processing device 210 may be implemented in at least a first wireless communications module, the interference detector 206 may be implemented in a second wireless communications module, and the coexistence optimization controller 208 may be implemented in either the first or the second wireless communications module. For yet another example, according to a third embodiment of the invention, more than one wireless communications module may comprise a signal processing device. The signal processing device 210 may be one signal processing device comprised in one wireless communications module, and the interference detector 206 may be another signal processing device comprised in another wireless communications module, and the coexistence optimization controller 208 may be either implemented as a dedicated device independent of the wireless communications modules, or may be implemented in either one of the wireless communications modules. Note that there are still some different ways for implementing the interference detector 206, the coexistence optimization controller 208 and the signal processing device 210, and the invention should not be limited to the examples as described above.

Figure 3:
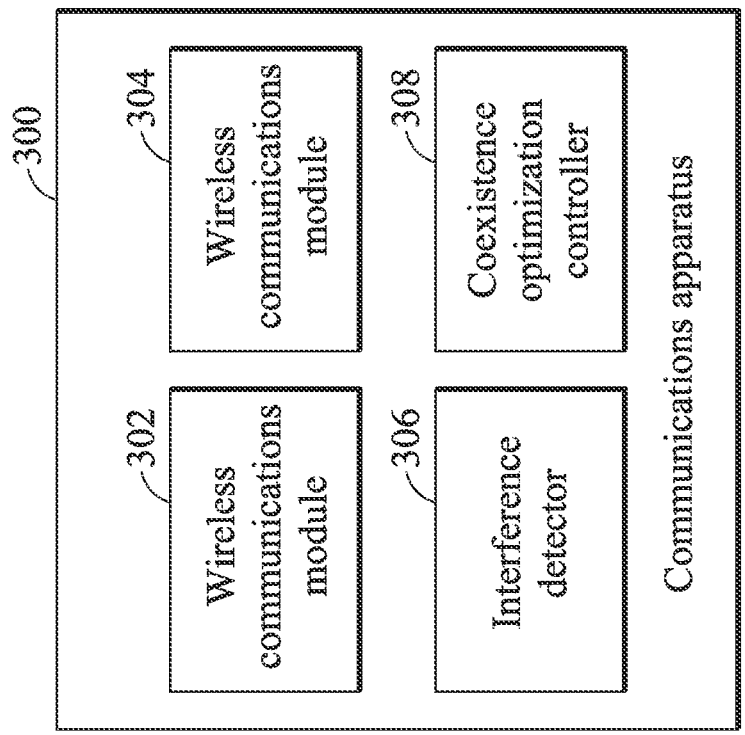
FIG. 3 shows a schematic block diagram of communications apparatus according to an embodiment of the invention.

FIG. 3 shows a schematic block diagram of a communications apparatus according to an embodiment of the invention. In order to clarify the concept of the invention, FIG. 3 presents a simplified block diagram, in which only the elements relevant to the invention are shown. However, note that the invention should not be limited to what is shown in the FIG. 3. The communications apparatus 300 may comprise a plurality of wireless communications modules 302 and 304, an interference detector 306 and a coexistence optimization controller 308. The interference detector 306 has a similar function as the interference detector 206 shown in FIG. 2, and the coexistence optimization controller 308 has a similar function as the coexistence optimization controller 208 shown in FIG. 2. In the embodiment, the signal processing device is implemented in the wireless communications module 302 and/or 304, and the interference detector 306 and the coexistence optimization controller 308 are implemented as dedicated devices outside of the wireless communications modules 302 and 304.

Figure 4:
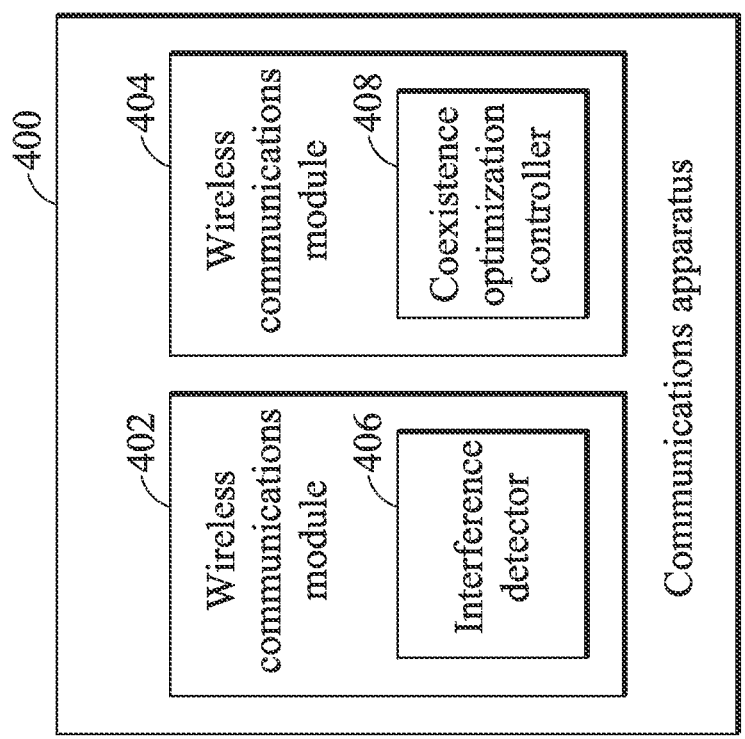
FIG. 4 shows a schematic block diagram of communications apparatus according to another embodiment of the invention.

FIG. 4 shows a schematic block diagram of a communications apparatus according to another embodiment of the invention. In order to clarify the concept of the invention, FIG. 4 presents a simplified block diagram, in which only the elements relevant to the invention are shown. However, note that the invention should not be limited to what is shown in the FIG. 4. The communications apparatus 400 may comprise a plurality of wireless communications modules 402 and 404, an interference detector 406 and a coexistence optimization controller 408. The interference detector 406 has a similar function as the interference detector 206 shown in FIG. 2, and the coexistence optimization controller 408 has a similar function as the coexistence optimization controller 208 shown in FIG. 2. In the embodiment, the signal processing device is implemented in the wireless communications module 302 and/or 304, and the interference detector 406 and the coexistence optimization controller 408 are respectively implemented in different wireless communications modules. Note that the interference detector 406 and the coexistence optimization controller 408 may also be implemented in the same wireless communications module, and the invention should not be limited thereto.

According to the embodiments of the invention, the wireless communications module may be a WiFi radio module, a Wimax radio module, a Bluetooth radio module, or others. The WiFi radio module may communicate with a WiFi device in compliance with the IEEE 802.11 protocol via the air interface. The Wimax radio module may communicate with a Wimax device in compliance with the IEEE 802.16 protocol via the air interface. The Bluetooth radio module may communicate with a Bluetooth device in compliance with the IEEE 802.15.1 protocol via the air interface. Each wireless communications module may be implemented as a single chip for providing the corresponding wireless communications services, or may be integrated into a combo chip (i.e., a system on chip (SoC)), and the invention should not be limited thereto.

To be more specific, according to some embodiments of the invention, the signal processing device 210, the coexistence optimization controller 208 and the interference detector 206 as shown in FIG. 2 may be integrated into a combo chip, or may be formed in different chips and integrated in a same printed circuit board. According to other embodiments of the invention, the signal processing device 210, the coexistence optimization controller 208 and the interference detector 206 as shown in FIG. 2 may be formed in different dies and packaged in a same package.

Figure 5:
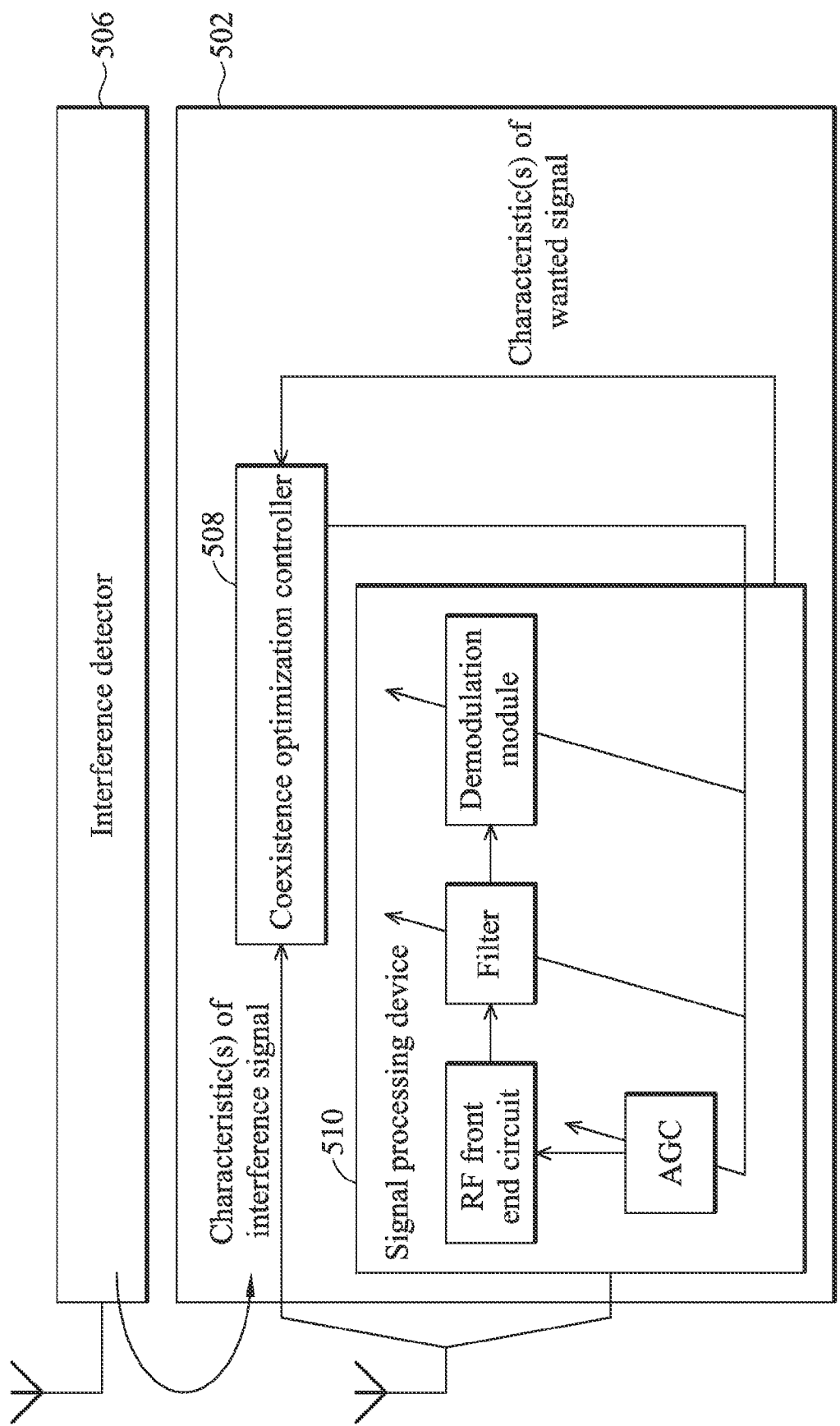
FIG. 5 shows a schematic block diagram of a communications apparatus according to another embodiment of the invention.

FIG. 5 shows a schematic block diagram of a communications apparatus according to another embodiment of the invention. Please be noted that FIG. 5 presents a simplified block diagram, in which some elements required by a conventional receiver are omitted here for brevity. However, note that the invention should not be limited to what is shown in the FIG. 5. In the embodiment, the coexistence optimization controller 508 and the signal processing device 510 are implemented in a wireless communications module 502, and the interference detector 506 may be a dedicated device or may be another signal processing device of another wireless communications module comprised in the communications apparatus. In the embodiment of the invention, the coexistence optimization controller 508 may receive the information regarding the characteristic(s) of the interference signal from the interference detector 506 in a wireless manner via a wireless connection established therebetween.

Figure 6:
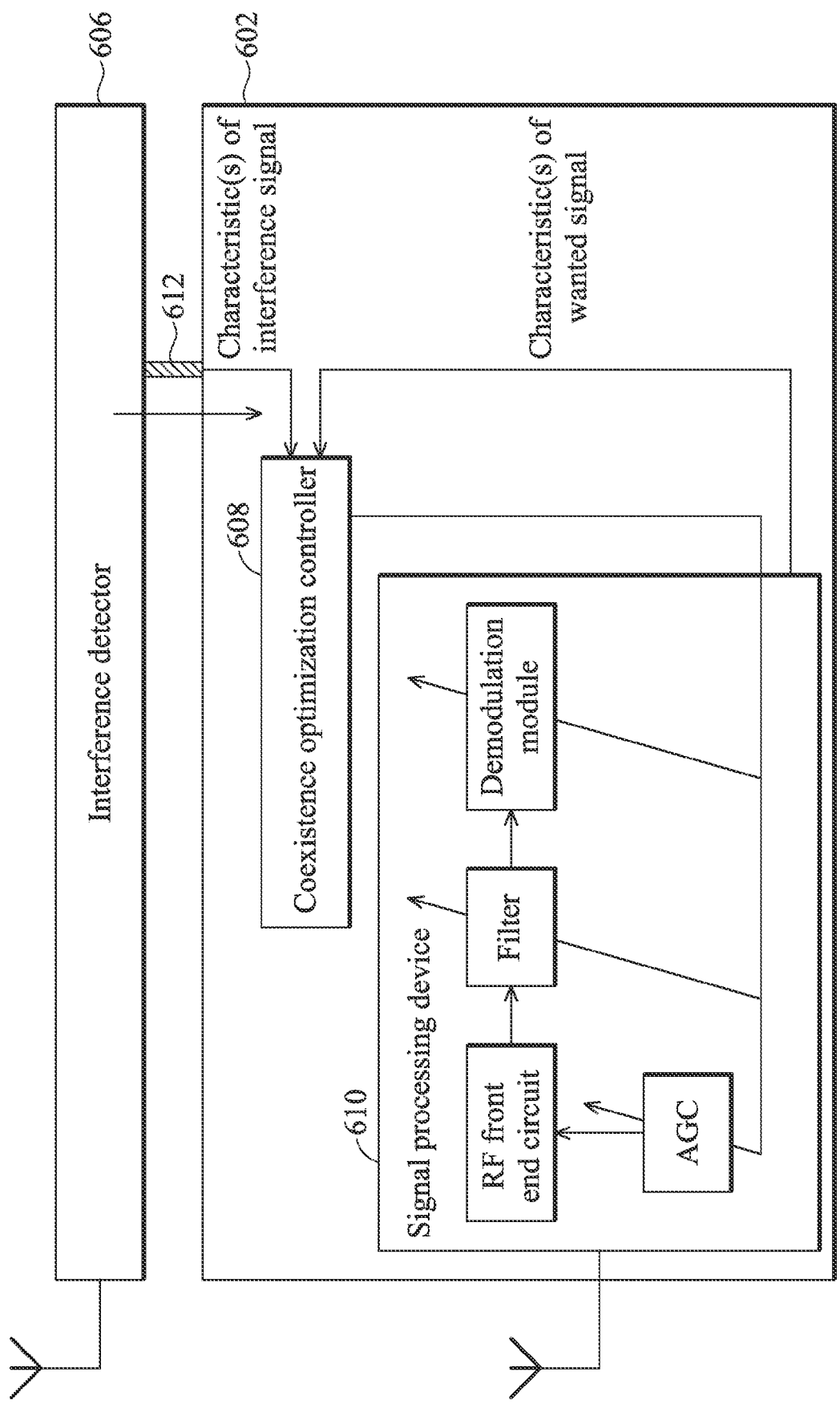
FIG. 6 shows a schematic block diagram of a communications apparatus according to yet another embodiment of the invention.

FIG. 6 shows a schematic block diagram of a communications apparatus according to yet another embodiment of the invention. Similarly, FIG. 6 presents a simplified block diagram, in which some elements are omitted. However, note that the invention should not be limited to what is shown in the FIG. 6. In the embodiment, the coexistence optimization controller 608 and the signal processing device 610 are implemented in a wireless communications module 602, and the interference detector 606 may be a dedicated device or may be another signal processing device of another wireless communications module comprised in the communications apparatus. In the embodiment of the invention, the coexistence optimization controller 608 may receive the information regarding the characteristic(s) of the interference signal from the interference detector 606 in a wired manner via a wire 612 connected therebetween. Note that FIG. 5 and FIG. 6 are illustrated here for showing the concept for transmitting/receiving the information regarding the characteristic(s) of the interference signal in different embodiments. However, the configurations of the wireless communications module, the signal processing device, the interference detector and the coexistence optimization controller should not be limited thereto.

Figure 1:
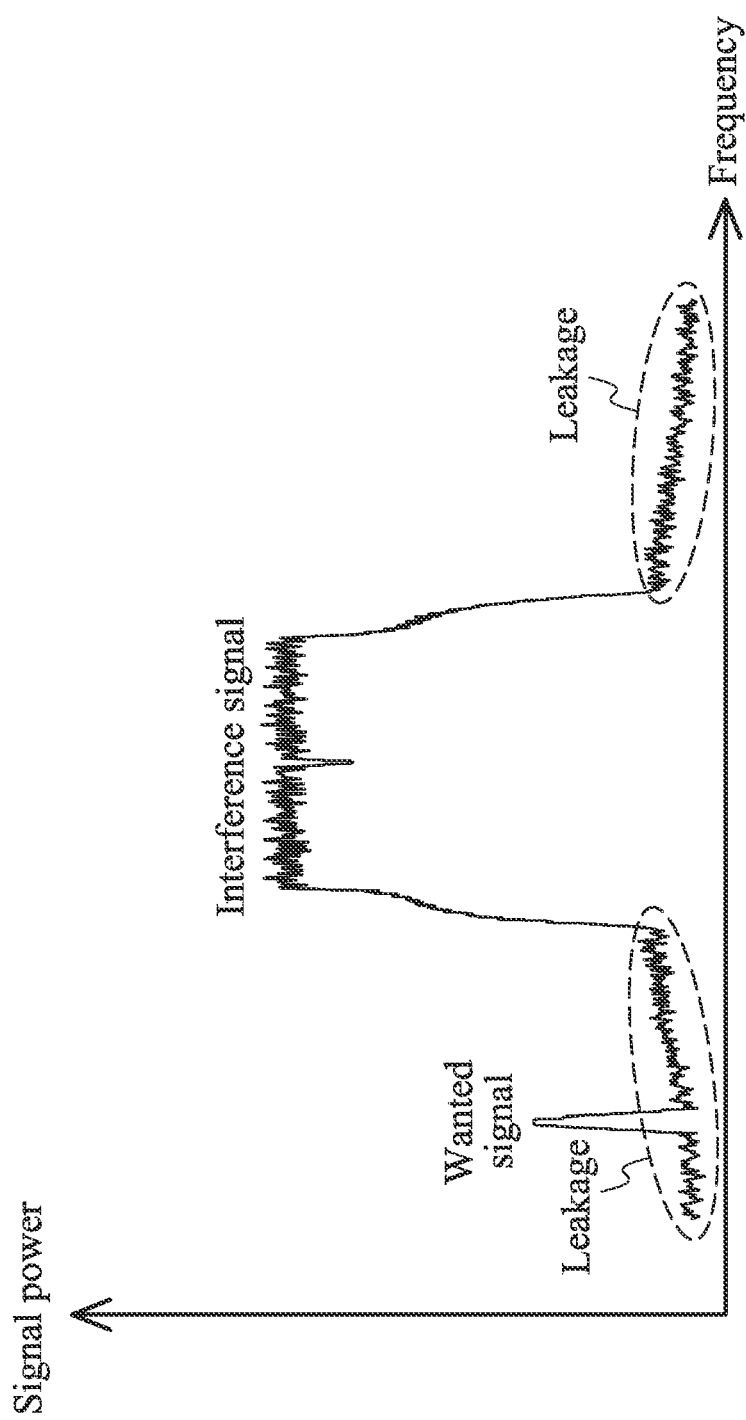
FIG. 1 shows an exemplary received signal power at around the 2.4 GHz band.

According to an embodiment of the invention, the interference detector (e.g. 206, 306, 406, 506 and/or 606) may detect, estimate or analyze the power, frequency, modulation type (i.e. modulation scheme utilized for modulating the interference signal) and/or an amount of skirt (i.e. leakage as shown in FIG. 1) of the interference signals, and provide information regarding the characteristic(s) of the interference signal to the coexistence optimization controller (e.g. 208, 308, 408, 508 and/or 608). For example, the interference detector (e.g. 206, 306, 406, 506 and/or 606) may detect whether there is any power in a predetermined frequency and estimate the power so as to obtain the power and frequency of the interference signal. For another example, the interference detector may detect the modulation type of the interference signal according to the type of the interference signal. To be more specific, the interference detector may know the modulation type of the interference signal after determining that the interference signal is a WiFi signal, a Bluetooth signal, a Wimax signal, or others because the possible modulation type may be predefined by the corresponding protocols.

The signal processing device (e.g. 210, 510 and/or 610) may also detect, estimate or analyze the power, frequency and modulation type of the wanted signal, and provide information regarding the characteristic(s) of the wanted signal to the coexistence optimization controller (e.g. 208, 308, 408, 508 and/or 608). The power, frequency and modulation type may be detected, estimated or analyzed by dedicated devices, or by the devices as shown in FIG. 2. The coexistence optimization controller (e.g. 208, 308, 408, 508 and/or 608) may dynamically adjust one or more signal processing parameter(s) utilized by the signal processing device (e.g. 210, 510 and/or 610) for processing the received signals so as to improve the SNR of the received signals, improve the robustness of the demodulator, and further prevent the RF front end circuit from operating nonlinearly.

According to an embodiment of the invention, as shown in FIG. 2, FIG. 5 and/or FIG. 6, the signal processing device (e.g. 210, 510 and/or 610) may at least comprise an RF front end circuit 212, an automatic gain control device (AGC) 214, a filter 216 and a demodulation module 218. The RF front end circuit 212 may at least comprise a low noise amplifier (LNA), a down converter and a low pass filter (LPF). The LNA is arranged to amplify very weak signals (for example, the RF signal captured by the antenna) according to a gain value. The down converter may comprise one or more mixers to perform frequency down conversion on the RF signal. The LPF is arranged to filter out the unwanted interference in the down converted signal and leave the wanted signal in the desired frequency band (for example, the IF signal or baseband signal). The AGC 214 is arranged to control the gain value of one or more amplifier(s) (such as the LNA) in the RF front end circuit 212. The filter 216 has an adjustable filter shape and bandwidth and is arranged to further filter out the unwanted interference or noise in the signal received from the RF front end circuit 212. Note that the filter 216 may be either a digital filter or an analog filter, and the invention should not be limited thereto. In other words, an analog to digital converter may be disposed either in front or back of the filter 216. The demodulation module 218 may comprise a plurality of different types of demodulators. FIG. 7 shows an exemplary block diagram of the demodulation module according to an embodiment of the invention. The demodulation module 718 may comprise three types of demodulators, such as a limiter discriminator integrator (LDI) demodulator, a phase differential detector and a Viterbi detector.

According to the embodiments of the invention, the adjustable signal processing parameters may comprise a gain value of an amplifier (such as the LNA in the RF front end circuit 212) in the signal processing device, a bandwidth and/or a shape of the filter (such as the filter 216 and/or the filter in the RF front end circuit 212) in the signal processing device, and/or a demodulator type (such as the demodulator type of the demodulator in the demodulation module 218 and/or 718) in the signal processing device. Based on the concept of the invention, the coexistence optimization controller (e.g. 208, 308, 408, 508 and/or 608) may dynamically adjust one or more signal processing parameter(s) utilized by the signal processing device (e.g. 210, 510 and/or 610) for processing the received signals according to the characteristic(s) of the interference signal and/or the characteristic(s) of the wanted signal, so as to improve the SNR of the received signals, improve the robustness of the demodulator, and further prevent the RF front end circuit from operating nonlinearly. The methods for dynamically adjusting one or more signal processing parameter(s) according to the characteristic(s) of the interference signal and/or the characteristic(s) of the wanted signal are further introduced in the following paragraphs.

FIG. 8 shows a flow chart of a method for dynamically adjusting one or more signal processing parameter(s) utilized by a signal processing device for processing a wanted signal according to an embodiment of the invention. The power and frequency of an interference signal may first be estimated or obtained by the interference detector (e.g. 206, 306, 406, 506 and/or 606) (Step S802). Next, the frequency spacing between the interference signal and the wanted signal may be determined by the coexistence optimization controller (e.g. 208, 308, 408, 508 and/or 608) (Step S804). Note that the coexistence optimization controller (e.g. 208, 308, 408, 508 and/or 608) may determine the frequency spacing according to the frequency of the interference signal provided by the interference detector (e.g. 206, 306, 406, 506 and/or 606) and the frequency of the wanted signal provided by the signal processing device (e.g. 210, 510 and/or 610). For example, the frequency spacing may be obtained by subtracting the frequency of the interference signal from the frequency of the wanted signal. Next, one or more suitable signal processing parameter(s) may be determined by the coexistence optimization controller (e.g. 208, 308, 408, 508 and/or 608) according to the power of the interference signal and the frequency spacing between the interference signal and the wanted signal (Step S806), and one or more signal processing parameter(s) for processing the wanted signal may be selected from the suitable signal processing parameter(s) by the coexistence optimization controller (e.g. 208, 308, 408, 508 and/or 608) (Step S808). The coexistence optimization controller (e.g. 208, 308, 408, 508 and/or 608) may adjust the signal processing parameter(s) utilized by the signal processing device (e.g. 210, 510 and/or 610) according to the selected signal processing parameter(s).

Figure 9:
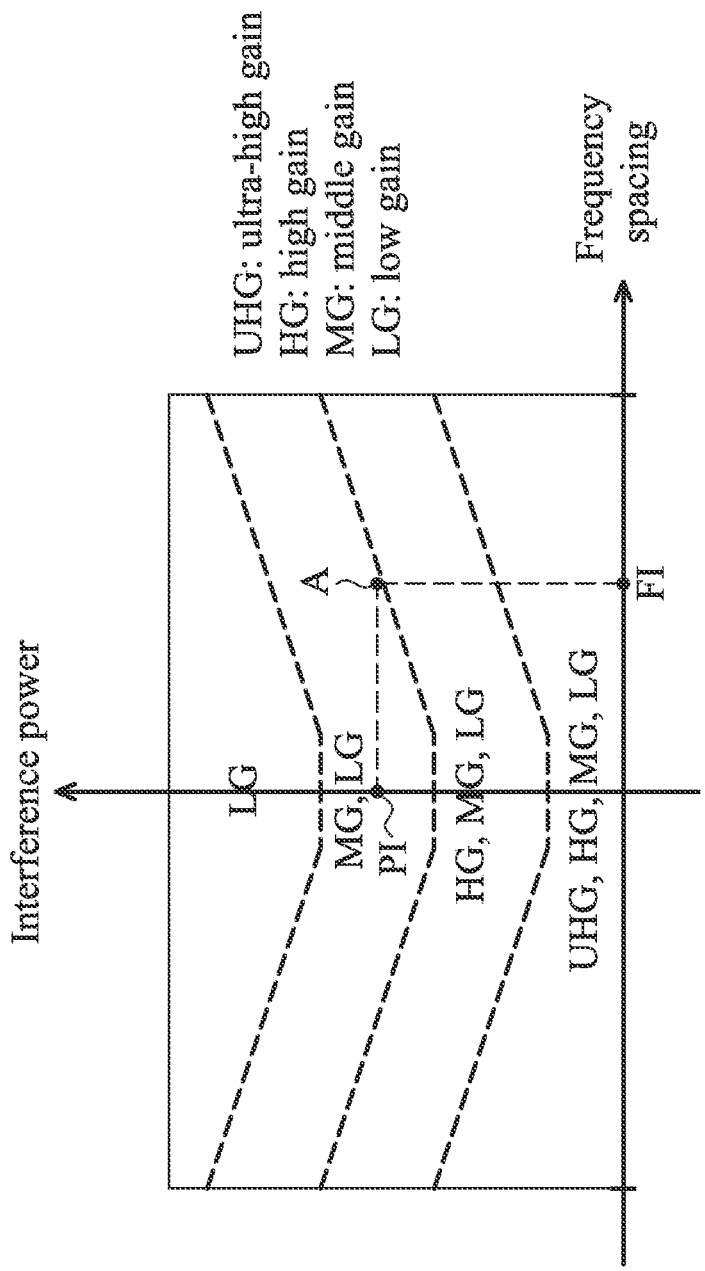
FIG. 9 shows the suitable signal processing parameters determined according to the power of the interference signal and the frequency spacing between the interference signal and the wanted signal according an embodiment of the invention.

FIG. 9 shows the suitable signal processing parameters determined according to the power of the interference signal and the frequency spacing between the interference signal and the wanted signal according an embodiment of the invention. As shown in FIG. 9, the x-axis represents the frequency spacing between the interference signal and the wanted signal and the y-axis represents the interference power. The signal processing parameter in the embodiment is a gain value utilized by an amplifier in the RF front end circuit, and in FIG. 9, an ultra-high gain (UHG) has a gain value higher than a high gain (HG), the HG has a gain value higher than a middle gain (MG), and the MG has a gain value higher than a low gain (LG). For example, when the interference power is PI and the frequency spacing is FI (i.e., point A), the coexistence optimization controller (e.g. 208, 308, 408, 508 and/or 608) determines MG and LG are more suitable. The coexistence optimization controller may further select MG or LG based on the estimated power level of the wanted signal. It can be seen from FIG. 9 that as power of an interference signal increases, the amplifier in the RF front end circuit is suggested to use a lower gain to amplify the received signal. This is because when a high gain is utilized to amplify the received RF signal comprising the interference signal and the wanted signal, if the interference power is high as shown in FIG. 1, the amplified interference signal may have a voltage level exceeding a voltage level of the supply power utilized in the RF front end circuit. This causes the RF front end circuit to be saturated and operate nonlinearly (that is, the signal cannot be linearly amplified).

Therefore, according to an embodiment of the invention, when the interference power increases, it is preferably for the coexistence optimization controller (e.g. 208, 308, 408, 508 and/or 608) to control the AGC 214 to reduce the gain value for the amplifier in the RF front end circuit so as to prevent the RF front end circuit from operating nonlinearly. Similarly, according to another embodiment of the invention, under the same interference power, when the frequency spacing between the interference signal and the wanted signal increases, it is preferably for the coexistence optimization controller (e.g. 208, 308, 408, 508 and/or 608) to control the AGC 214 to increase the gain value for the amplifier in the RF front end circuit so as to improve the SNR.

Figure 10:
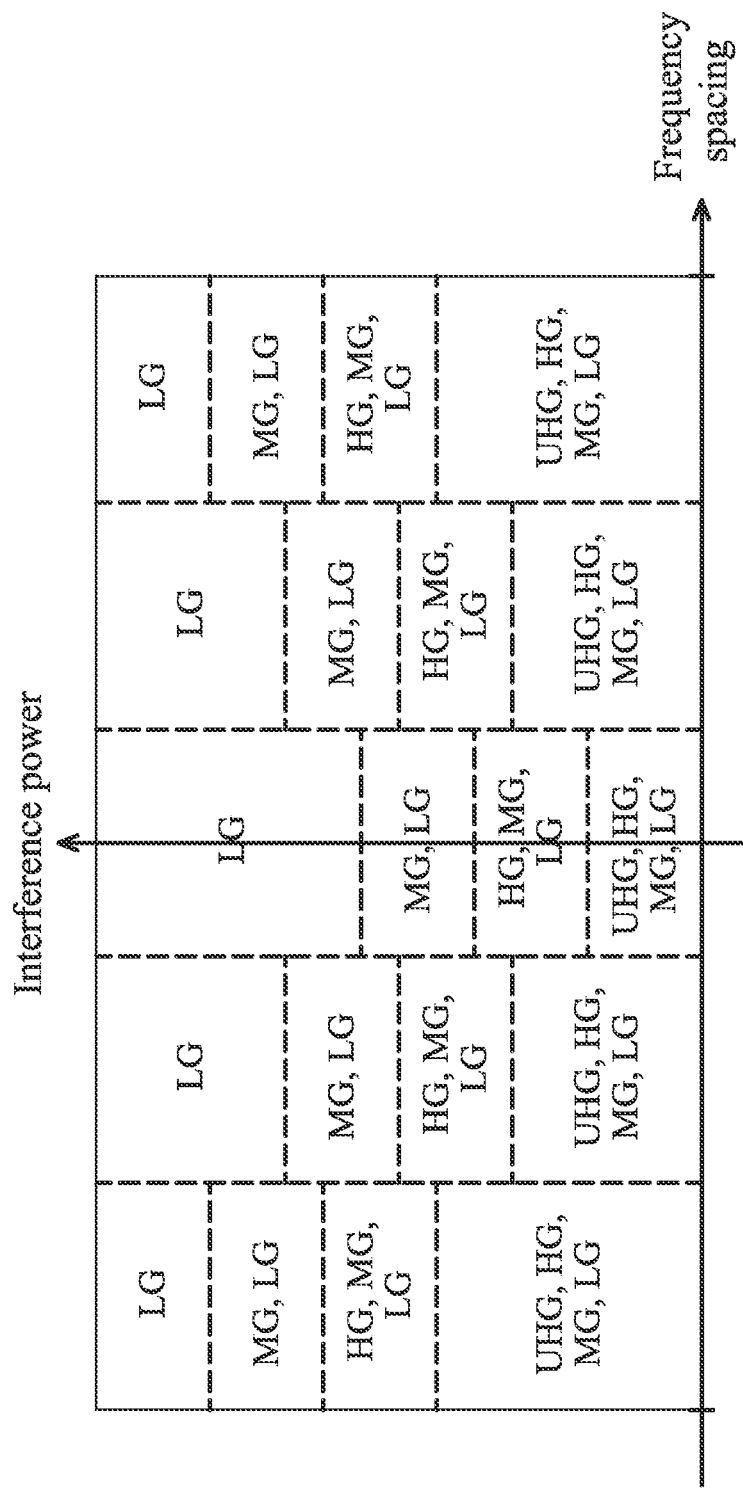
FIG. 10 shows the suitable signal processing parameters determined according to the power of the interference signal and the frequency spacing between the interference signal and the wanted signal according to another embodiment of the invention.

FIG. 10 shows the suitable signal processing parameters determined according to the power of the interference signal and the frequency spacing between the interference signal and the wanted signal according to another embodiment of the invention. When implementing the concept as shown in FIG. 9 in practice, the interference power and the frequency spacing may be quantized by several threshold values so as to form several zooms, and the suitable signal processing parameters may be determined for each zoom. The coexistence optimization controller (e.g. 208, 308, 408, 508 and/or 608) may further adjust the signal processing parameter(s) utilized by the signal processing device (e.g. 210, 510 and/or 610) for processing the received signal by selecting the signal processing parameter(s) from the suitable signal processing parameters according to the characteristic(s) of the wanted signal. For example, as show in FIG. 10, when the interference power and the frequency spacing are both zero, the coexistence optimization controller (e.g. 208, 308, 408, 508 and/or 608) may select a low gain (LG) from the suitable processing parameters LG, MG, HG and UHG when the wanted signal power is high, and select an ultra high gain (UHG) from the suitable processing parameters LG, MG, HG and UHG when the wanted signal power is extremely low. Note that the coexistence optimization controller (e.g. 208, 308, 408, 508 and/or 608) may also select the signal processing parameter(s) from the suitable signal processing parameters according to a modulation type of the wanted signal, and the invention should not be limited thereto.

In addition, in the embodiments of the invention, a modulation type of the interference signal may further be utilized by the coexistence optimization controller (e.g. 208, 308, 408, 508 and/or 608) for determining the suitable signal processing parameters. For example, the relationships between the suitable signal processing parameters and the interference power versus the frequency spacing may be different for different modulation types. Therefore, there may be several sets of suitable signal processing parameters determined according to the power of the interference signal and the frequency spacing as shown in FIG. 10 for different modulation types of the interference signal.

Figure 11:
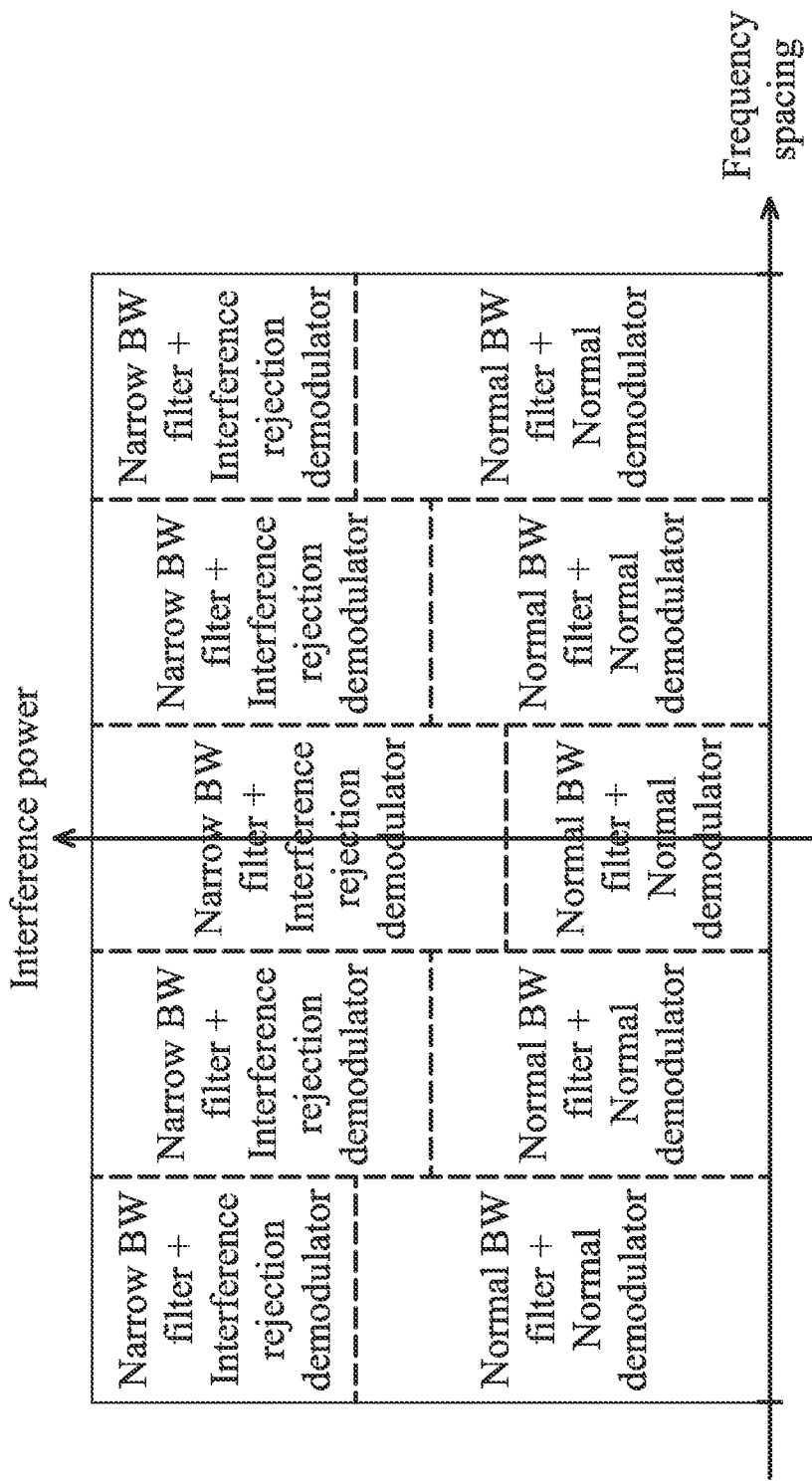
FIG. 11 shows the suitable signal processing parameters determined according to the power of the interference signal and the frequency spacing between the interference signal and the wanted signal according yet another embodiment of the invention.

FIG. 11 shows the suitable signal processing parameters determined according to the power of the interference signal and the frequency spacing between the interference signal and the wanted signal according yet another embodiment of the invention. In this embodiment, the signal processing parameters comprise a filter bandwidth of a filter and a demodulator type of a demodulator of the signal processing device (e.g. 210, 510 and/or 610). Because the leakage of the interference signal (the leakage as shown in FIG. 1) may also influence the wanted signal, in some embodiments of the invention, the coexistence optimization controller (e.g. 208, 308, 408, 508 and/or 608) may estimate an amount of leakage adjacent to the wanted signal according to the interference power and the frequency spacing, and determine a suitable filter bandwidth and demodulator type for filtering out the leakage of the interference signal. For example, when the amount of leakage adjacent to the wanted signal is large, the filter bandwidth is preferably reduced and the anti-interference capability of demodulation is preferably increased, so as to filter out most of the leakage of the interference signal adjacent to the wanted signal and reduce demodulation errors.

As shown in FIG. 11, when the power of an interference signal increases, or under the same interference power, when the frequency spacing between the interference signal and the wanted signal decreases, the amount of leakage of the interference signal adjacent to the wanted signal might be increased. Therefore, a filter having a narrower bandwidth (the narrow BW filter as shown) and a demodulator having a more robust anti-interference capability (the interference rejection demodulator as shown) are suggested to be used. On the contrary, when the power of an interference signal decreases, or under the same interference power, when the frequency spacing between the interference signal and the wanted signal increases, the amount of leakage of the interference signal adjacent to the wanted signal might be decreased. Therefore, a filter having a wider bandwidth (the normal BW filter as shown) and a demodulator having a less robust anti-interference capability (the normal demodulator) are suggested to be used. The normal demodulator may be, for example but not limited to, a direct demodulator which directly outputs hard decision values for the demodulation results.

Figure 12:
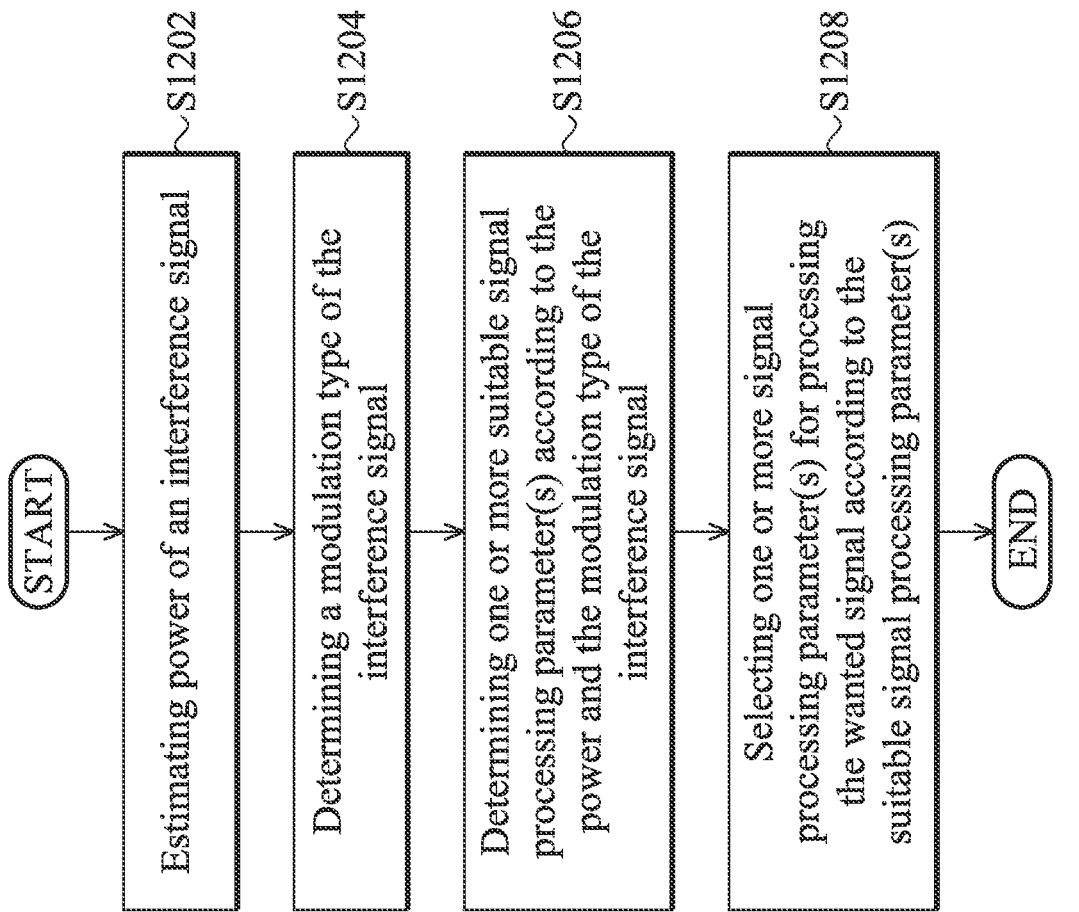
FIG. 12 shows a flow chart of a method for dynamically adjusting one or more signal processing parameter(s) utilized by a signal processing device for processing a wanted signal according to another embodiment of the invention.

In some other embodiments of the invention, the signal processing parameter(s) may also be determined and adjusted according to other characteristics of the interference signal. FIG. 12 shows a flow chart of a method for dynamically adjusting one or more signal processing parameter(s) utilized by a signal processing device for processing a wanted signal according to another embodiment of the invention. The power and a modulation type of an interference signal may first be estimated or obtained by the interference detector (e.g. 206, 306, 406, 506 and/or 606) (Steps S1202 and S1204). Next, one or more suitable signal processing parameter(s) may be determined by the coexistence optimization controller (e.g. 208, 308, 408, 508 and/or 608) according to the power and modulation type of the interference signal (Step S1206), and one or more signal processing parameter(s) for processing the wanted signal may be selected from the suitable signal processing parameter(s) by the coexistence optimization controller (e.g. 208, 308, 408, 508 and/or 608) (Step S1208). The coexistence optimization controller (e.g. 208, 308, 408, 508 and/or 608) may adjust the signal processing parameter(s) utilized by the signal processing device (e.g. 210, 510 and/or 610) according to the selected signal processing parameter (s).

FIG. 13 shows the suitable signal processing parameters determined according to the power and modulation type of the interference signal according an embodiment of the invention. As shown in FIG. 13, the x-axis represents the modulation type of the interference signal and the y-axis represents the interference power, and in the embodiment, the signal processing parameter is a gain value for an amplifier in the RF front end circuit. In FIG. 13, two modulation types are shown, including the Orthogonal frequency-division multiplexing (OFDM) and Complimentary Code Keying (CCK). The coexistence optimization controller (e.g. 208, 308, 408, 508 and/or 608) may determine different sets of the suitable signal processing parameters for the OFDM and CCK. Based on the similar concept, FIG. 14 shows the suitable signal processing parameters determined according to the power and modulation type of the interference signal according to another embodiment of the invention. In the embodiment, the signal processing parameters comprise a filter bandwidth of a filter and a demodulator type of a demodulator of the signal processing device (e.g. 210, 510 and/or 610). As shown in FIG. 14, the coexistence optimization controller (e.g. 208, 308, 408, 508 and/or 608) may also determine different sets of the suitable signal processing parameters for the OFDM and CCK.

Note that in the embodiments of the invention, a frequency spacing between the interference signal and the wanted signal may further be utilized by the coexistence optimization controller (e.g. 208, 308, 408, 508 and/or 608) for determining the suitable signal processing parameters, and the invention should not be limited thereto. In addition, the coexistence optimization controller (e.g. 208, 308, 408, 508 and/or 608) may select the signal processing parameter(s) from the suitable signal processing parameters according to power and/or a modulation type of the wanted signal as previously described, and the invention should not be limited thereto.

Figures 15, 16:
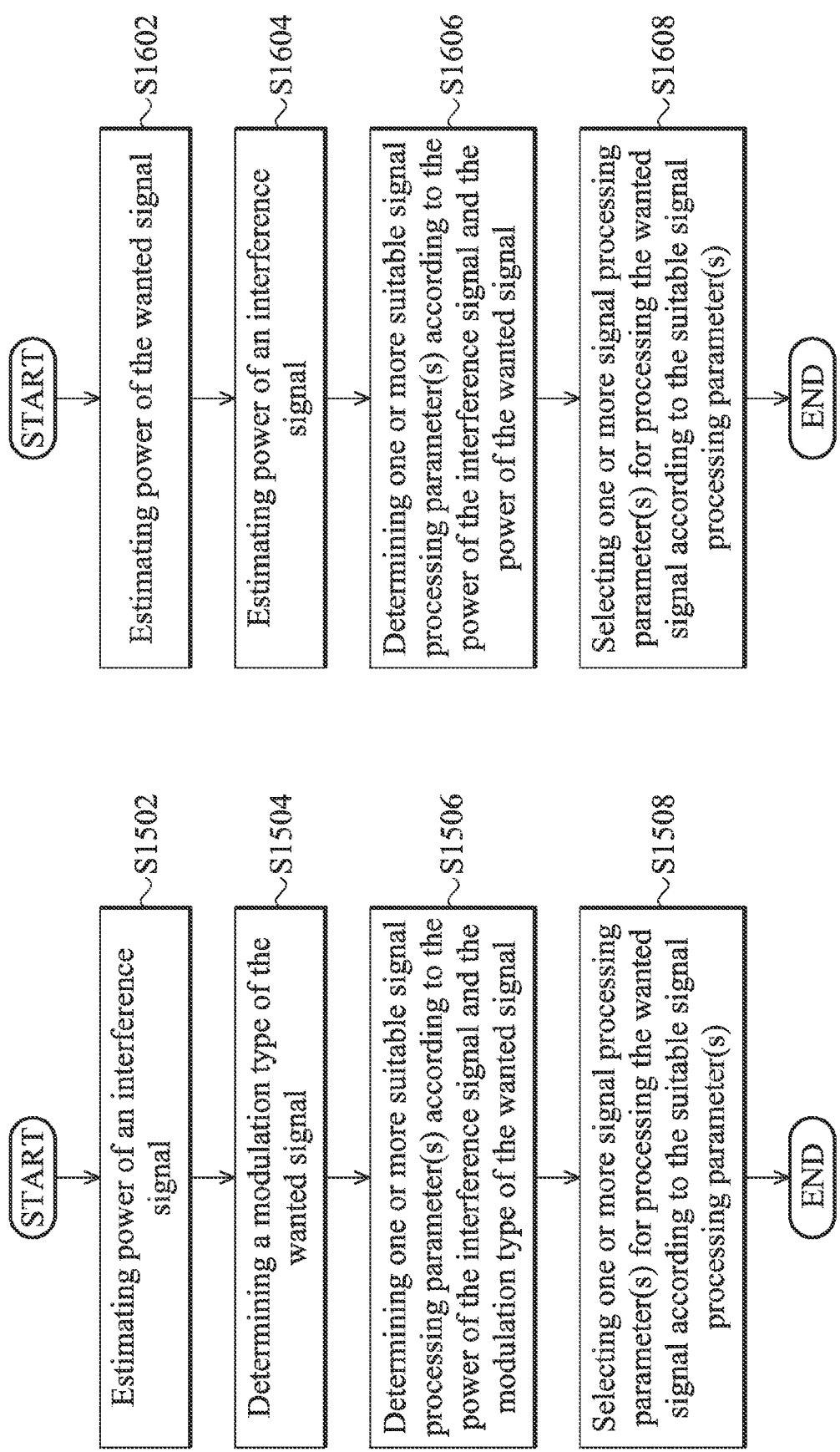
FIG. 15 shows a flow chart of a method for dynamically adjusting one or more signal processing parameter(s) utilized by a signal processing device for processing a wanted signal according to yet another embodiment of the invention.
FIG. 16 shows a flow chart of a method for dynamically adjusting one or more signal processing parameter(s) utilized by a signal processing device for processing a wanted signal according to yet another embodiment of the invention.

In yet some other embodiments of the invention, the signal processing parameter(s) may also be determined and adjusted according to yet other characteristics of the interference signal. FIG. 15 shows a flow chart of a method for dynamically adjusting one or more signal processing parameter(s) utilized by a signal processing device for processing a wanted signal according to yet another embodiment of the invention. In the embodiment, the power of an interference signal may be estimated or obtained by the interference detector (e.g. 206, 306, 406, 506 and/or 606) (Steps S1502) and a modulation type of the wanted signal may be determined by the signal processing device (e.g. 210, 510 and/or 610) (Steps S1504). Next, one or more suitable signal processing parameter(s) may be determined by the coexistence optimization controller (e.g. 208, 308, 408, 508 and/or 608) according to the power of the interference signal and modulation type of the wanted signal (Step S1506), and one or more signal processing parameter(s) for processing the wanted signal may be selected from the suitable signal processing parameter(s) by the coexistence optimization controller (e.g. 208, 308, 408, 508 and/or 608) (Step S1508). The coexistence optimization controller (e.g. 208, 308, 408, 508 and/or 608) may adjust the signal processing parameter(s) utilized by the signal processing device (e.g. 210, 510 and/or 610) according to the selected signal processing parameter(s).

Note that in the embodiments of the invention, a frequency spacing between the interference signal and the wanted signal and/or the modulation type of the interference signal may further be utilized by the coexistence optimization controller (e.g. 208, 308, 408, 508 and/or 608) for determining the suitable signal processing parameters, and the invention should not be limited thereto. In addition, the coexistence optimization controller (e.g. 208, 308, 408, 508 and/or 608) may select the signal processing parameter(s) from the suitable signal processing parameters according to power of the wanted signal as previously described, and the invention should not be limited thereto. The signal processing parameter(s) may comprise a gain value of an amplifier, a filter bandwidth and/or a filter shape of a filter and/or a demodulator type of a demodulator of the signal processing device (e.g. 210, 510 and/or 610).

In yet some other embodiments of the invention, the signal processing parameter(s) may also be determined and adjusted according to yet other characteristics of the interference signal. FIG. 16 shows a flow chart of a method for dynamically adjusting one or more signal processing parameter(s) utilized by a signal processing device for processing a wanted signal according to yet another embodiment of the invention. In the embodiment, power of the wanted signal may be estimated by the signal processing device (e.g. 210, 510 and/or 610) (Steps S1602) and power of an interference signal may be estimated or obtained by the interference detector (e.g. 206, 306, 406, 506 and/or 606) (Steps S1604). Next, one or more suitable signal processing parameter(s) may be determined by the coexistence optimization controller (e.g. 208, 308, 408, 508 and/or 608) according to the power of the interference signal and the power of the wanted signal (Step S1606), and one or more signal processing parameter(s) for processing the wanted signal may be selected from the suitable signal processing parameter(s) by the coexistence optimization controller (e.g. 208, 308, 408, 508 and/or 608) (Step S1608). The coexistence optimization controller (e.g. 208, 308, 408, 508 and/or 608) may adjust the signal processing parameter(s) utilized by the signal processing device (e.g. 210, 510 and/or 610) according to the selected signal processing parameter(s).

Note that in the embodiments of the invention, a frequency spacing between the interference signal and the wanted signal and/or the modulation type of the interference signal may further be utilized by the coexistence optimization controller (e.g. 208, 308, 408, 508 and/or 608) for determining the suitable signal processing parameters, and the invention should not be limited thereto. In addition, the coexistence optimization controller (e.g. 208, 308, 408, 508 and/or 608) may select the signal processing parameter(s) from the suitable signal processing parameters according to the modulation type of the wanted signal as previously described, and the invention should not be limited thereto. The signal processing parameter(s) may comprise a gain value of an amplifier, a filter bandwidth and/or a filter shape of a filter and/or a demodulator type of a demodulator of the signal processing device (e.g. 210, 510 and/or 610).

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A communications apparatus, comprising:
a signal processing device, receiving a radio frequency (RF) signal comprising a wanted signal complying with a first wireless communications protocol from an air interface and processing the RF signal according to one or more signal processing parameter(s) to obtain the wanted signal;
an interference detector, analyzing one or more characteristic(s) of an interference signal of the wanted signal, wherein the interference signal complies with a second wireless communications protocol different from the first wireless communication protocols, wherein the characteristic(s) of the interference signal comprise(s) power, a frequency, a modulation type and/or an amount of leakage of the interference signal; and
a coexistence optimization controller, coupled to the signal processing device and the interference detector, obtaining information regarding the characteristic(s) of the interference signal from the interference detector and dynamically limiting a maximum usable gain of a amplifier according to the characteristic(s) of the interference signal.

2. The communications apparatus as claimed in claim 1, further comprising:
a first wireless communications module, providing a first wireless communications service; and a second wireless communications module, providing a second wireless communications service,
wherein the signal processing device is comprised in the first wireless communications module and the interference detector is comprised in the second wireless communications module.

3. The communications apparatus as claimed in claim 1, wherein the signal processing device and the interference detector are formed in different chips and integrated in a same printed circuit board.

4. The communications apparatus as claimed in claim 1, wherein the signal processing device and the interference detector are formed in different dies and packaged in a same package.

5. The communications apparatus as claimed in claim 1, wherein the coexistence optimization controller receives the information regarding the characteristic(s) of the interference signal from the interference detector via a wire connected therebetween.

6. The communications apparatus as claimed in claim 1, wherein the coexistence optimization controller receives the information regarding the characteristic(s) of the interference signal from the interference detector via a wireless connection established therebetween.

7. The communications apparatus as claimed in claim 1, wherein the signal processing device further analyzes one or more characteristic(s) of the wanted signal, and the coexistence optimization controller obtains information regarding the characteristic(s) of the wanted signal from the signal processing device and dynamically adjusts the signal processing parameter(s) further according to the characteristic(s) of the wanted signal.

8. The communications apparatus as claimed in claim 7, wherein the characteristic(s) of the wanted signal comprise(s) power, a frequency and/or a modulation type of the wanted signal.

9. The communications apparatus as claimed in claim 7, wherein the coexistence optimization controller further determines one or more suitable signal processing parameter(s) according to the characteristic(s) of the interference signal, and selects the signal processing parameter(s) from the suitable signal processing parameter(s) according to the characteristic(s) of the wanted signal.

10. The communications apparatus as claimed in claim 1, wherein the signal processing device comprises:
an RF front end circuit, comprising the amplifier;
a filter; and
a demodulation module, comprising a plurality of different types of demodulators, wherein the signal processing parameter(s) comprise(s) the maximum usable gain of the amplifier, a bandwidth and/or a shape of the filter, and/or a demodulator type.

11. The communications apparatus as claimed in claim 1, wherein the characteristic(s) of the interference signal comprise(s) power, a frequency, a modulation type and/or an amount of leakage of the interference signal.

12. A method for dynamically adjusting one or more signal processing parameter(s) utilized by a signal processing device for processing a wanted signal, comprising:
obtaining information regarding power and frequency of an interference signal being an interference of the wanted signal;
determining a frequency spacing between the interference signal and the wanted signal;
determining one or more suitable signal processing parameter(s) according to the power of the interference signal and the frequency spacing between the interference signal and the wanted signal; and
selecting one or more signal processing parameter(s) for processing the wanted signal according to the suitable signal processing parameter(s),
wherein the signal processing parameter comprises a maximum usable gain utilized for amplifying the wanted signal.

13. The method as claimed in claim 12, further comprising:
obtaining information regarding a modulation type of the interference signal; and
determining the one or more suitable signal processing parameter(s) further according to the modulation type of the interference signal.

14. The method as claimed in claim 12, further comprising:
estimating power of the wanted signal,
wherein the signal processing parameter(s) is/are selected from the suitable signal processing parameter(s) according to the power of the wanted signal.

15. The method as claimed in claim 12, further comprising:
determining a modulation type of the wanted signal,
wherein the signal processing parameter(s) is/are selected from the suitable signal processing parameter(s) according to the modulation type of the wanted signal.

16. The method as claimed in claim 12, wherein one of the signal processing parameter(s) is the maximum usable gain utilized for amplifying the wanted signal, and when the power of an interference signal increases, the method further comprises:
selecting a lower gain for amplifying the wanted signal.

17. The method as claimed in claim 12, wherein one of the signal processing parameter(s) is the maximum usable utilized for amplifying the wanted signal, and when the frequency spacing between the interference signal and the wanted signal increases, the method further comprises:
selecting a higher gain for amplifying the wanted signal.

18. The method as claimed in claim 12, wherein the signal processing parameter(s) further comprise(s) a filter bandwidth and/or a filter shape utilized for filtering the wanted signal and/or a demodulator type utilized for demodulating the wanted signal.

19. The method as claimed in claim 12, wherein one of the signal processing parameter(s) is a filter bandwidth utilized for filtering the wanted signal, and when the power of an interference signal increases, the method further comprises:
selecting a filter having a narrower bandwidth for filtering the wanted signal.

20. The method as claimed in claim 12, wherein one of the signal processing parameter(s) is a filter bandwidth utilized for filtering the wanted signal, and when the frequency spacing between the interference signal and the wanted signal increases, the method further comprises:
selecting a filter having a wider bandwidth for filtering the wanted signal.

21. The method as claimed in claim 12, wherein one of the signal processing parameter(s) is a demodulator type utilized for demodulating the wanted signal, and when the power of the interference signal increases, the method further comprises:
selecting a demodulator having a more robust anti-interference capability for demodulating the wanted signal.

22. The method as claimed in claim 12, wherein one of the signal processing parameter(s) is a demodulator type utilized for demodulating the wanted signal, and when the frequency spacing between the interference signal and the wanted signal increases, the method further comprises:

selecting a demodulator having a less robust anti-interference capability for demodulating the wanted signal.

23. A method for dynamically adjusting one or more signal processing parameter(s) utilized by a signal processing device for processing a wanted signal, comprising:
    obtaining information regarding power of an interference signal being an interference of the wanted signal;
    obtaining information regarding a modulation type of the interference signal;
    determining one or more suitable signal processing parameter(s) according to the power and the modulation type of the interference signal; and
    selecting one or more signal processing parameter(s) for processing the wanted signal according to the suitable signal processing parameter(s),
    wherein the signal processing parameter comprises a maximum usable gain utilized for amplifying the wanted signal.

24. The method as claimed in claim 23, further comprising:
    determining a frequency spacing between the interference signal and the wanted signal; and
    determining the one or more suitable signal processing parameter(s) further according to the frequency spacing between the interference signal and the wanted signal.

25. The method as claimed in claim 23, further comprising:
    estimating power of the wanted signal,
    wherein the signal processing parameter(s) is/are selected from the suitable signal processing parameter(s) according to the power of the wanted signal.

26. The method as claimed in claim 23, further comprising:
    determining a modulation type of the wanted signal,
    wherein the signal processing parameter(s) is/are selected from the suitable signal processing parameter(s) according to the modulation type of the wanted signal.

27. The method as claimed in claim 23, wherein the signal processing parameter(s) further comprise(s) a filter bandwidth and/or a filter shape utilized for filtering the wanted signal and/or a demodulator type utilized for demodulating the wanted signal.

28. A method for dynamically adjusting one or more signal processing parameter(s) utilized by a signal processing device for processing a wanted signal, comprising:
    obtaining information regarding power of an interference signal being an interference of the wanted signal;
    determining a modulation type of the wanted signal;
    determining one or more suitable signal processing parameter(s) according to the power of the interference signal and the modulation type of the wanted signal; and
    selecting one or more signal processing parameter(s) for processing the wanted signal according to the suitable signal processing parameter(s),
    wherein the signal processing parameter comprises a maximum usable gain utilized for amplifying the wanted signal.

29. The method as claimed in claim 28, further comprising:
    determining a frequency spacing between the interference signal and the wanted signal; and
    determining the one or more suitable signal processing parameter(s) further according to the frequency spacing between the interference signal and the wanted signal.

30. The method as claimed in claim 28, further comprising:
    determining a modulation type of the interference signal; and
    determining the one or more suitable signal processing parameter(s) further according to the modulation type of the interference signal.

31. The method as claimed in claim 28, further comprising:
    estimating power of the wanted signal,
    wherein the signal processing parameter(s) is/are selected from the suitable signal processing parameter(s) according to the power of the wanted signal.

32. The method as claimed in claim 19, wherein the signal processing parameter(s) further comprise(s) a filter bandwidth and/or a filter shape utilized for filtering the wanted signal and/or a demodulator type utilized for demodulating the wanted signal.

33. A communications apparatus, comprising:
    a signal processing device, receiving a radio frequency (RF) signal comprising a wanted signal complying with a first wireless communications protocol from an air interface and processing the RF signal according to one or more signal processing parameter(s) to obtain the wanted signal;
    an interference detector, analyzing one or more characteristic(s) of an interference signal of the wanted signal, wherein the interference signal complies with a second wireless communications protocol different from the first wireless communication protocols; and
    a coexistence optimization controller, coupled to the signal processing device and the interference detector, obtaining information regarding the characteristic(s) of the interference signal from the interference detector and set a filter bandwidth for the wanted signal according to the characteristic(s) of the interference signal, wherein the filter bandwidth is smaller than a signal bandwidth of the wanted signal.

34. A communications apparatus, comprising:
    a signal processing device, comprising a plurality of different types of demodulators, the signal processing device receiving a radio frequency (RF) signal comprising a wanted signal complying with a first wireless communications protocol from an air interface and processing the RF signal according to one or more signal processing parameter(s) to obtain the wanted signal;
    an interference detector, analyzing one or more characteristic(s) of an interference signal of the wanted signal, wherein the interference signal complies with a second wireless communications protocol different from the first wireless communication protocols; and
    a coexistence optimization controller, coupled to the signal processing device and the interference detector, obtaining information regarding the characteristic(s) of the interference signal from the interference detector and dynamically select one of the different types demodulators according to the characteristic(s) of the interference signal.

* * * * *